(12) United States Patent
Morikawa

(10) Patent No.: US 10,482,798 B2
(45) Date of Patent: Nov. 19, 2019

(54) DISPLAY UNIT AND ELECTRONIC APPARATUS

(71) Applicant: JOLED INC., Tokyo (JP)

(72) Inventor: Shinichiro Morikawa, Tokyo (JP)

(*) Notice: Subject to any disclaimer, the term of this patent is extended or adjusted under 35 U.S.C. 154(b) by 0 days.

(21) Appl. No.: 16/183,741

(22) Filed: Nov. 8, 2018

(65) Prior Publication Data

US 2019/0096290 A1    Mar. 28, 2019

Related U.S. Application Data

(63) Continuation of application No. 15/590,179, filed on May 9, 2017, now Pat. No. 10,163,374, which is a (Continued)

(30) Foreign Application Priority Data

Dec. 4, 2014  (JP) .................................. 2014-245946

(51) Int. Cl.
*H01L 51/52* (2006.01)
*G09F 9/30* (2006.01)
(Continued)

(52) U.S. Cl.
CPC ............ *G09F 9/30* (2013.01); *H01L 27/3244* (2013.01); *H01L 27/3246* (2013.01);
(Continued)

(58) Field of Classification Search
CPC .......... G09F 9/30; H05B 33/04; H05B 33/22; H01L 27/3244; H01L 27/3258; H01L 51/5253; H01L 27/3246; H01L 51/524
See application file for complete search history.

(56) References Cited

U.S. PATENT DOCUMENTS

2003/0209708 A1   11/2003  Kubota
2005/0218396 A1   10/2005  Tsuchiya et al.
(Continued)

FOREIGN PATENT DOCUMENTS

JP     2003-282241 A    10/2003
JP     2005-302707 A    10/2005
(Continued)

OTHER PUBLICATIONS

International Search Report in PCT/JP2015/065847, dated Sep. 1, 2015.

*Primary Examiner* — Donald L Raleigh
(74) *Attorney, Agent, or Firm* — Hauptman Ham, LLP

(57) ABSTRACT

An electronic apparatus includes a display region comprising a plurality of pixels are disposed. The electronic apparatus further includes a peripheral region outside the display region. The electronic apparatus further includes an inorganic film in the peripheral region. The inorganic film surrounds the display region continuously. The electronic apparatus further includes a pixel separation film between adjacent pixels of the plurality of pixels. The pixel separation film exposes a portion of the inorganic film. Each pixel of the plurality of pixels includes a light-emitting element. The light-emitting element includes a first electrode, an organic layer on the first electrode, and a second electrode on the organic layer. The organic layer includes a light-emitting layer, and the organic layer is over the pixel separation film. The second electrode extending continuously from the display region to the peripheral region and directly contacts the inorganic film.

13 Claims, 10 Drawing Sheets

Related U.S. Application Data continuation of application No. PCT/JP2015/065847, filed on Jun. 2, 2015.

(51) Int. Cl.
*H05B 33/04* (2006.01)
*H05B 33/22* (2006.01)
*H01L 27/32* (2006.01)

(52) U.S. Cl.
CPC ........ *H01L 27/3258* (2013.01); *H01L 51/524* (2013.01); *H01L 51/5253* (2013.01); *H05B 33/04* (2013.01); *H05B 33/22* (2013.01)

(56) References Cited

U.S. PATENT DOCUMENTS

| | | |
|---|---|---|
| 2006/0033429 A1 | 2/2006 | Fujimura et al. |
| 2007/0085475 A1 | 4/2007 | Kuwabara et al. |
| 2007/0120473 A1 | 5/2007 | Nakamura et al. |
| 2009/0115321 A1 | 5/2009 | Hayashi |
| 2010/0072482 A1 | 3/2010 | Eom et al. |
| 2014/0070174 A1 | 3/2014 | Kwon et al. |
| 2014/0117333 A1 | 5/2014 | Lee et al. |
| 2014/0291641 A1* | 10/2014 | Negishi ............... H01L 51/5253 257/40 |
| 2015/0116295 A1* | 4/2015 | Pyon .................... H01L 27/3276 345/211 |
| 2015/0160767 A1 | 6/2015 | Song et al. |
| 2015/0207100 A1 | 7/2015 | Saito et al. |

FOREIGN PATENT DOCUMENTS

| | | |
|---|---|---|
| JP | 2006-54111 A | 2/2006 |
| JP | 2009-117079 A | 5/2009 |
| JP | 2014-199739 A | 10/2014 |
| WO | 2014/020899 A2 | 2/2014 |

* cited by examiner

DISPLAY UNIT AND ELECTRONIC APPARATUS

CROSS REFERENCE TO RELATED APPLICATIONS

This is a continuation of U.S. application Ser. No. 15/590,179, filed May 9, 2017, which is a continuation of International Application No. PCT/JP2015/065847, filed Jun. 2, 2015, which claims the benefit of Japanese Priority Patent Application JP2014-245946, filed Dec. 4, 2014, the entire contents of all of which are incorporated herein by reference.

BACKGROUND

The disclosure relates to a display unit that emits light utilizing, for example, an organic electroluminescence (EL) phenomenon, and an electronic apparatus including the display unit.

In association with an improvement in mass production efficiency of a display panel and in pursuit of design of the display panel, display units such as televisions have recently been requested to have a narrower so-called bezel part around a display region in which display elements are disposed. However, it is more likely that narrowing the bezel part causes entry of foreign matters such as moisture from the outside to reach the display region. In particular, in an organic EL display unit that uses an organic EL device as a display device, the entry of the foreign matters such as moisture deteriorates the organic EL device, which forms a non-emission region often referred to as a dark spot and decreases display quality accordingly.

For example, as a way of suppressing the entry of the foreign matters such as moisture into the display region, Japanese Unexamined Patent Application Publication (JP-A) Nos. 2009-117079 and 2003-282241 each disclose an organic EL unit in which a gas barrier film configured by an inorganic insulating film having a high sealing property is formed around the display region. For example, JP-A No. 2006-054111 discloses a display unit that includes a peripheral region having a separating groove. The separating groove separates an organic insulating film that covers the entire surface of a support substrate into an inner peripheral part and an outer peripheral part. By providing the separating groove in the peripheral region, the display unit disclosed in JP-A No. 2006-054111 suppresses the entry of the foreign matters such as moisture from the outside into the display region, and reduces entry of moisture remaining in the organic insulating film into the display region as well.

SUMMARY

Presence of a defect in an organic insulating film located closer to a display region than a separating groove may serve as a route of entry, into the display region, of foreign matters such as moisture present outside a display unit or remaining inside the display unit, causing a decrease in reliability. The defect is often caused especially by a contact of a mask used upon forming a layer that structures an organic EL device, such as a light-emission layer, by means of a vacuum vapor deposition method.

It is desirable to provide a display unit that achieves high reliability while achieving a narrower bezel, and an electronic apparatus that includes the display unit.

A display unit according to an embodiment of the disclosure includes: a display region in which a plurality of pixels are disposed; a peripheral region provided outside the display region; and an inorganic film that is provided in the peripheral region, and surrounds the display region continuously.

An electronic apparatus according to an embodiment of the disclosure is provided with a display unit. The display unit includes: a display region in which a plurality of pixels are disposed; a peripheral region provided outside the display region; and an inorganic film that is provided in the peripheral region, and surrounds the display region continuously.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

In the following, some example embodiments of the disclosure are described in detail, in the following order, with reference to the accompanying drawings.
1. Example Embodiment (an example in which an inorganic film is provided, in a peripheral region, in the same layer as a pixel electrode)
  1-1. Basic Configuration
  1-2. Overall Configuration
  1-3. Workings and Effect
2. Modification Examples
  2-1. First Modification Example (an example in which the inorganic film is provided on a pixel separation film)

2-2. Second Modification Example (an example in which an organic insulating film provided between a substrate and the inorganic film is removed)

3. Application Examples (examples in each of which a display unit is applied to an electronic apparatus)

Note that the following description is directed to illustrative examples of the technology and not to be construed as limiting to the technology. Further, factors including, without limitation, arrangement, dimensions, and a dimensional ratio of elements illustrated in each drawing are illustrative only and not to be construed as limiting to the technology.

[1. Example Embodiment]

[1-1. Basic Configuration]

Figure 1:
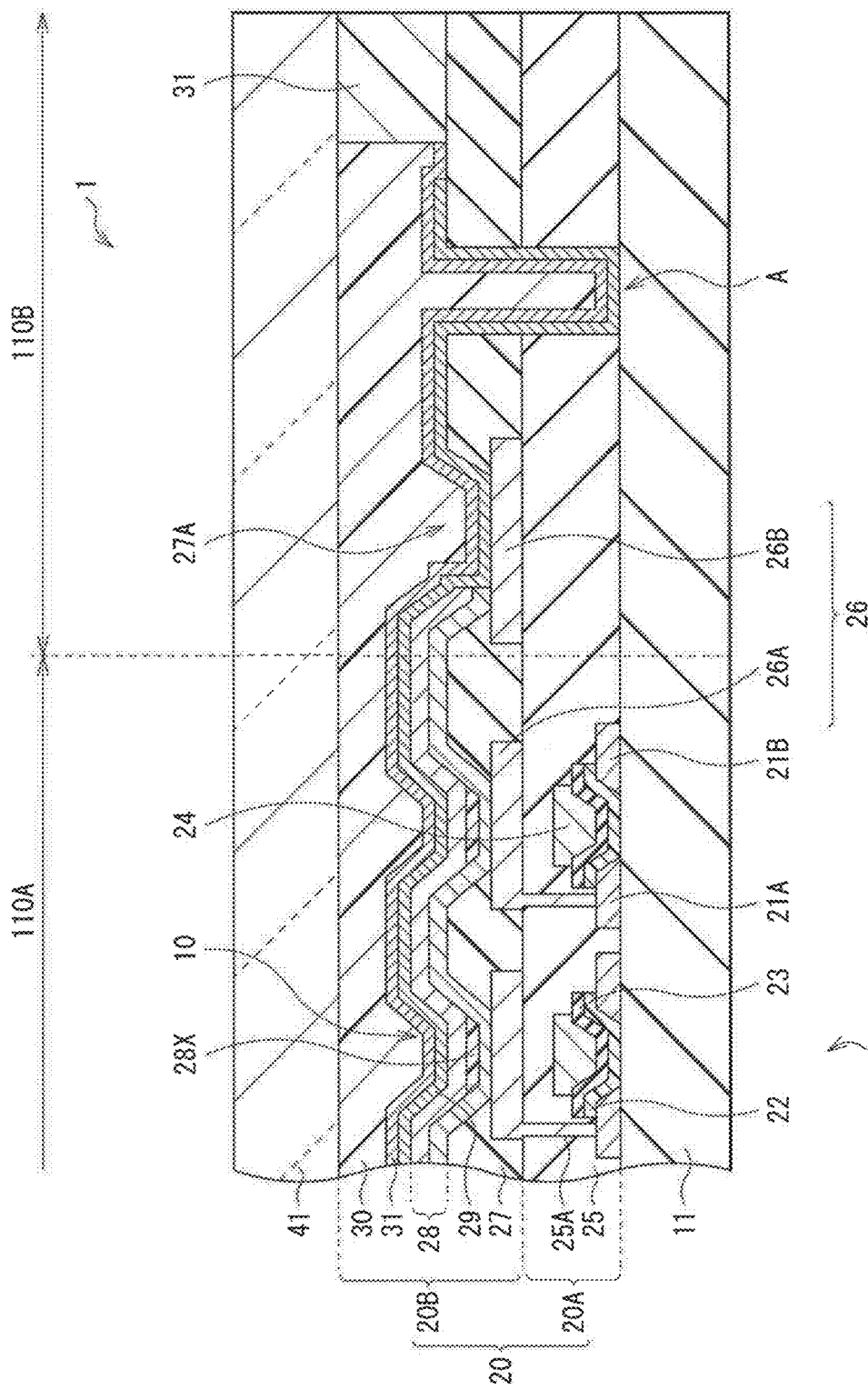
FIG. 1 is a cross-sectional view of a display unit according to an example embodiment of the disclosure.
Figure 2:
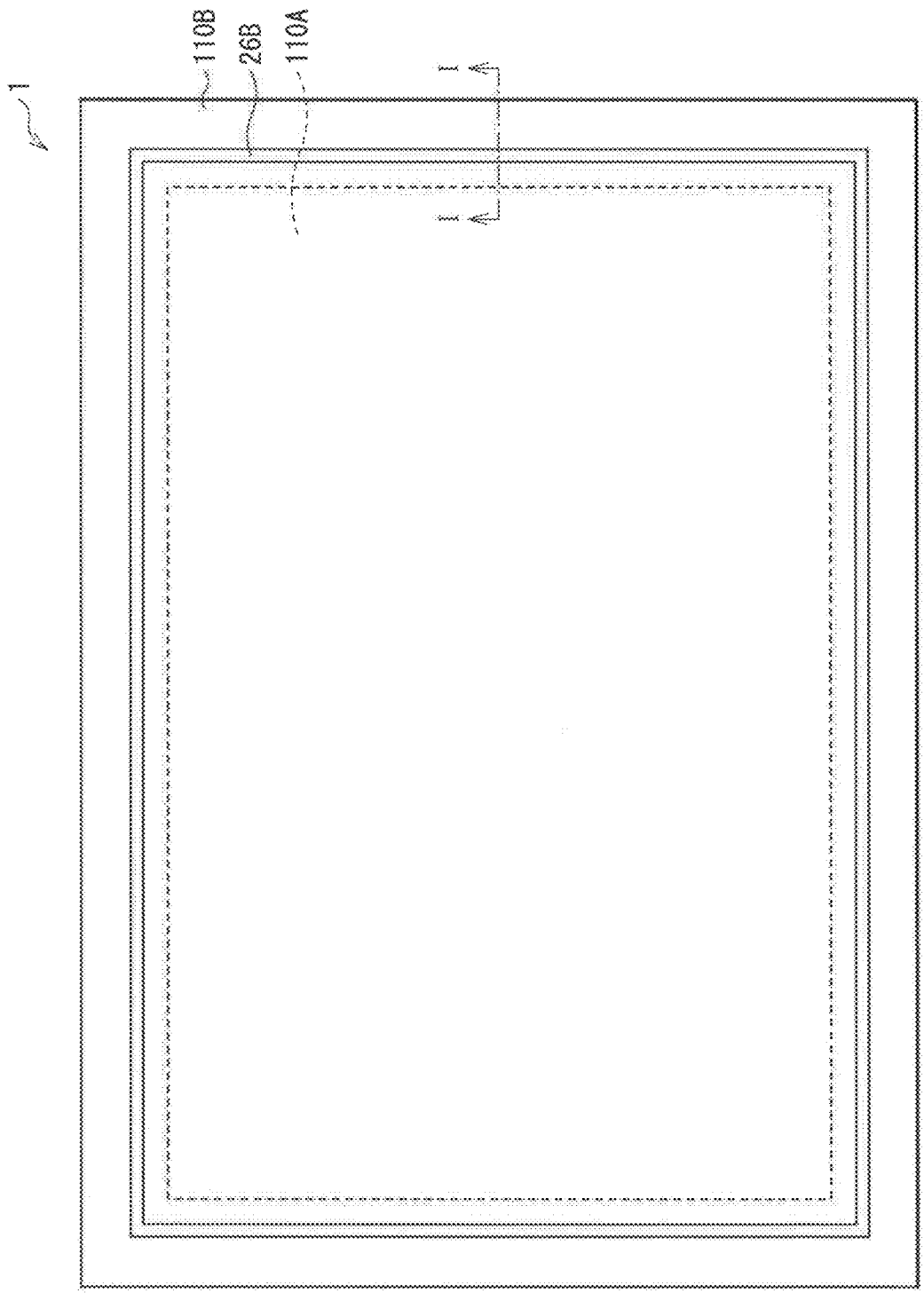
FIG. 2 schematically illustrates a planar configuration of the display unit illustrated in FIG. 1.

FIG. 1 illustrates a cross-sectional configuration of a display unit, referred to as a display unit 1, according to an example embodiment of the disclosure. FIG. 2 schematically illustrates a planar configuration of the display unit 1 illustrated in FIG. 1. Note that FIG. 1 is a cross-sectional view of the display unit 1 taken along line I-I of FIG. 2. The display unit 1 may be used for a display section of a television apparatus, or a display section of a mobile terminal such as a tablet device and a smartphone. The display unit 1 may include, as a display panel, a display region 110A and a peripheral region 110B on a drive substrate 11. The peripheral region 110B may be provided around the display region 110A. The display region 110A may include organic EL elements 10 (organic EL elements 10R, 10G, and 10B) as display elements. For example, the organic EL elements 10 each may emit corresponding one of color light beams of R (red), G (green), and B (blue). The organic EL elements 10 each may have a configuration in which corresponding one of the color light beams is outputted from the top surface side, i.e., from a surface opposite to the drive substrate 11, meaning that the display unit 1 may be a so-called top-emission display unit without limitation.

Figure 3:
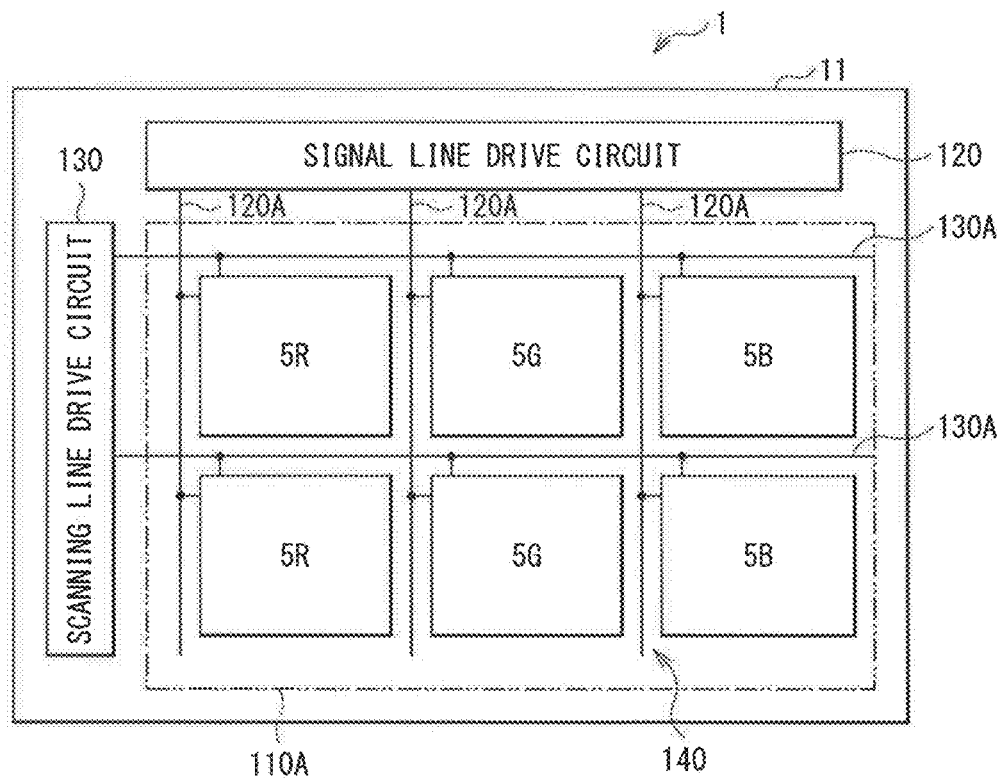
FIG. 3 illustrates an overall configuration of the display unit illustrated in FIG. 1.

Referring to FIG. 2, the display unit 1 according to the example embodiment includes a protection film 26B in the peripheral region 110B. The protection film 26B surrounds the display region 110A continuously, and is made of an inorganic material. The protection film 26B is an inorganic film referred to as an inorganic film 26, and may be provided in the same layer as a pixel electrode 26A. Referring to FIG. 3, the protection film 26B provided in the peripheral region 110B may be preferably disposed outside the outermost circumference of a plurality of pixels 5 disposed in matrix. Further, in one embodiment where the peripheral region 110B has a separating groove A as in the example embodiment, the protection film 26B may be preferably provided closer to the display region 110A than the separating groove A. The separating groove A may separate a planarization insulating film 25 and a pixel separation film 27, both extending in the display region 110A and the peripheral region 110B, into an inner peripheral part and an outer peripheral part in the peripheral region 110B. In one specific but non-limiting example where an organic layer 28 structuring the organic EL element 10 is to be formed with use of a mask 1000 (see FIG. 6) by means of a vacuum vapor deposition method, the protection film 26B may be preferably provided in a region W that corresponds to an end face 1000A of an opening 1000H of the mask 1000. This configuration makes it possible to prevent the planarization insulating film 25 from being damaged by a contact of the end face 1000A of the mask 1000 with the planarization insulating film 25, and thereby to prevent entry of foreign matters such as moisture into the display region 110A. Preferably, at least a part of the pixel separation film 27 provided after the formation of the protection film 26B may be removed such that the pixel separation film 27 is separated on the protection film 26B into an inner peripheral part and an outer peripheral part, as with the separating groove A provided on the planarization insulating film 25.

[1-2. Overall Configuration]

FIG. 3 illustrates an example of an overall configuration of the display unit 1 illustrated in FIGS. 1 and 2. In the display region 110A, the plurality of pixels 5 (red pixels 5R, green pixels 5G, and blue pixels 5B) are disposed in matrix. Further, a signal line drive circuit 120 and a scanning line drive circuit 130 serving as drivers directed to image display may be provided in the peripheral region 110B. The peripheral region 110B may be located at the periphery (on the outer edge side or on the outer peripheral side) of the display region 110A. In other words, the peripheral region 110B is provided outside the display region 110A.

Figure 4:
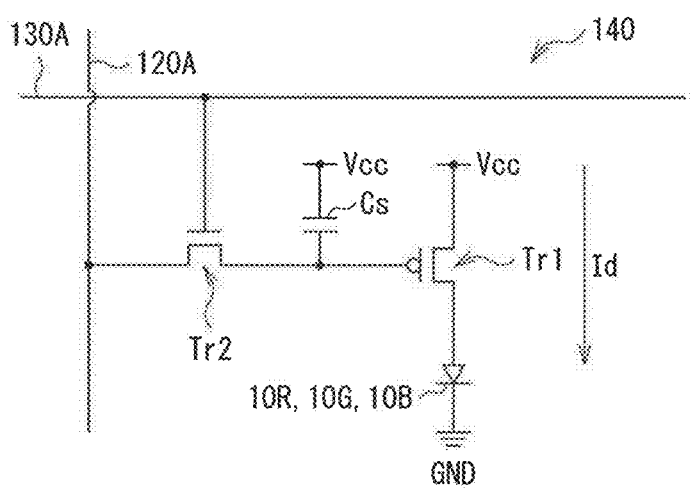
FIG. 4 illustrates an example of a pixel drive circuit illustrated in FIG. 3.

A pixel drive circuit 140 may be provided in the display region 110A. FIG. 4 illustrates an example of the pixel drive circuit 140 (an example of a pixel circuit of each of the red pixel 5R, the green pixel 5G, and the blue pixel 5B). The pixel drive circuit 140 may be an active drive circuit provided as a lower layer of a pixel electrode 26A to be described later. The pixel drive circuit 140 may include a drive transistor Tr1, a write transistor Tr2, and a capacitor (holding capacitor) Cs provided between the drive transistor Tr1 and the write transistor Tr2. The pixel drive circuit 140 may also include the organic EL elements 10R, 10G, or 10B coupled in series to the drive transistor Tr1 between a first power supply line (Vcc) and a second power supply line (GND). In other words, the red pixel 5R, the green pixel 5G, and the blue pixel 5B each may include corresponding one of the organic EL elements 10R, 10G, and 10B that emit the corresponding color light beams. The drive transistor Tr1 and the write transistor Tr2 each may be configured by a typical thin-film transistor (TFT). The configuration of each of the drive transistor Tr1 and the write transistor Tr2 is not particularly limited, and either may be, for example, an inverted staggered structure (so-called a bottom gate structure), or may be a staggered structure (a top gate structure).

The pixel drive circuit 140 may include a plurality of signal lines 120A in a column direction, and a plurality of scanning lines 130A in a row direction. An intersection of any of the signal lines 120A and any of the scanning lines 130A may correspond to one of the red pixel 5R, the green pixel 5G, and the blue pixel 5B. Each of the signal lines 120A may be coupled to the signal line drive circuit 120. Image signals may be supplied from the signal line drive circuit 120 to source electrodes of the respective write transistors Tr2 through the signal lines 120A. Each of the scanning lines 130A may be coupled to the scanning line drive circuit 130. Scanning signals may be supplied sequentially from the scanning line drive circuit 130 to gate electrodes of the respective write transistors Tr2 through the scanning lines 130A.

Hereinafter, a description is given of components configuring the display unit 1.

The display unit 1 may include the drive substrate 11 and the counter substrate 41 that are disposed to face each other with a display layer 20 being interposed therebetween. The display layer 20 may have a configuration in which a TFT section 20A and a display section 20B are stacked. The TFT section 20A may include thin-film transistors 20X that drive the respective organic EL elements 10 (10R, 10G, and 10B). The display section 20B may include the organic EL elements 10 (10R, 10G, and 10B). In the present example embodiment, the drive substrate 11 and the counter substrate 41 form a complete solid structure in which the entire internal surfaces thereof sealed by a sealing section 31 are joined together by a filling layer 30.

The drive substrate 11 may be a supporting body having a main surface (located on the display surface side) on which the organic EL elements 10 of the respective colors (the red organic EL element 10R, the green organic EL element 10G, and the blue organic EL element 10B) are formed in an array. Non-limiting examples of the drive substrate 11 may include quartz and glass; a substrate made of a plastic such as polyether sulfone, polycarbonate, polyimides, polyamides, polyacetals, polyethylene terephthalate, polyethylene naphthalate, polyethylene ether ketone, and polyolefins; a metal foil substrate made of a metal such as aluminum (Al), nickel (Ni), copper (Cu), and stainless steel having undergone a surface insulating treatment; and paper. A buffer layer for enhancing adhesion and flatness or a functional film such as a barrier film for enhancing a gas barrier property may also be formed on any of the above-described substrates. Further, when it is possible to form a channel layer 22 without heating the drive substrate 11 by means of a method such as a sputtering method, it is also possible to use an inexpensive plastic film for the drive substrate 11.

The drive transistor Tr1, the write transistor Tr2, and various wiring lines may be provided in the TFT section 20A provided on the drive substrate 11. The planarization insulating film 25 may be provided on the drive transistor Tr1, the write transistor Tr2, and the wiring lines. While the drive transistor Tr1 and the write transistor Tr2 (hereinafter, each may be referred to as the thin-film transistor 20X) each may be either of a top gate type or of a bottom gate type, a description is given here by referring to an example in which the thin-film transistor 20X is of the top gate type. The thin-film transistor 20X may have a configuration in which a pair of source-drain electrodes (a source electrode 21A and a drain electrode 21B), the channel layer 22, a gate insulating film 23, and a gate electrode 24 are provided in this order from the drive substrate 11, with the planarization insulating film 25 that planarizes the TFT section 20A being further provided.

The source electrode 21A and the drain electrode 21B may be provided apart from each other, and may be electrically coupled to the channel layer 22. A metal material, a semi-metal, or an inorganic semiconductor material may be used as a material that forms the source electrode 21A and the drain electrode 21B. Specific but non-limiting examples of the material may include a metal simple substance such as platinum (Pt), titanium (Ti), ruthenium (Ru), molybdenum (Mo), copper (Cu), tungsten (W), nickel (Ni), aluminum (Al), gold (Au), silver (Ag), and tantalum (Ta); and an alloy thereof. Other non-limiting examples of the material may include an indium-tin oxide (ITO) and a molybdenum oxide (MoO). The source electrode 21A and the drain electrode 21B each may be made of any of the metal simple substances or an alloy thereof; a monolayer thereof or two or more layers thereof may also be stacked for use. Non-limiting examples of the layered structure may include a layered structure defined as Ti/Al/Ti and a layered structure defined as Mo/Al.

The channel layer 22 may be provided in an island shape between the source electrode 21A and the drain electrode 21B, and may have a channel region at a position that faces the gate electrode 24 to be described later, for example. The channel layer 22 may have a thickness in a range from 5 nm to 100 nm, for example. The channel layer 22 may be made of an organic semiconductor material such as a peri-Xanthenoxanthene (PXX) derivative. Non-limiting examples of the organic semiconductor material may include polythiophene, poly-3-hexylthiophene (P3HT) in which a hexyl group is introduced into polythiophene, pentacene[2,3,6,7-dibenzoanthracene], polyanthracene, naphthacene, hexacene, heptacene, dibenzopentacene, tetrabenzopentacene, chrysene, perylene, coronene, terrylene, ovalene, quoterrylene, circumanthracene, benzopyrene, dibenzopyrene, triphenylene, polypyrrole, polyaniline, polyacetylene, polydiacetylene, polyphenylene, polyfuran, polyindole, polyvinyl carbazole, polyselenophene, polytellurophene, polyisothianaphthene, polycarbazole, polyphenylene sulfide, polyphenylene vinylene, polyphenylene sulfide, polyvinylene sulfide, polythienylene vinylene, polynaphthalene, polypyrene, polyazulene, phthalocyanines represented by copper phthalocyanine, merocyanine, hemicyanine, polyethylene dioxythiophene, pyridazine, naphthalene tetracarboxylic acid diimide, poly(3,4-ethylendioxythiophene)/polystyrenesulfonic acid (PEDOT/PSS), 4,4'-biphenyldithiole (BPDT), 4,4'-diisocyanobiphenyl, 4,4'-diisocyano-p-terphenyl, 2,5-bis(5'-thioacetyl-2'-thiophenyl)thiophene, 2,5-bis (5'-thioacetoxyl-2'-thiophenyl)thiophene, 4,4'-diisocyanophenyl, benzidine (biphenyl-4-4'-diamine), TCNQ (tetracyanoquinodimethane), charge-transfer complexes represented by a tetrathiafulvalene (TTF)-TCNQ complex, a bisethylenetetrathiafulvalene (BEDTTTF)-perchloric acid complex, a BEDTTTF-iodine complex, and a TCNQ-iodine complex, biphenyl-4,4'-dicarboxylic acid, 24-di(4-thiophenylacetylinyl)-2-ethylbenzene, 24-di(4-isocyanophenylacetylinyl)-2-ethylbenzene, dendrimer, fullerenes such as C60, C70, C76, C78, and C84, 24-di(4-thiophenylethynyl)-2-ethylbenzene, 2,2"-dihydroxy-1,1':4',1"-terphenyl, 4,4'-biphenyldiethanal, 4,4'-biphenyldiol, 4,4'-biphenyldisocyanate, 24-diacetylbenzene, diethylbiphenyl-4,4'-dicarboxylate, benzo[22-c;3,4-c';5,6-c]tris[22] dithiol-24,7-trithion, α-sexithiophene, tetrathiotetracene, tetraselenotetracene, tetratelluric tetracene, poly(3-alkyl thiophene), poly(3-thiophene-β-ethanesulfonic acid), poly (N-alkylpyrrole)poly(3-alkylpyrrole), poly(3,4-dialkylpyrrole), poly(2,2'-thienylpyrrole), and poly(dibenzothiophene sulfide), and quinacridone. In addition, it is also possible to use a compound selected from the group of condensed polycyclic aromatic compounds, porphyrin derivatives, phenyl vinylidene-based conjugated oligomers, and thiophene-based conjugated oligomers. Further, a mixture of an organic semiconductor material and an insulating polymer material may also be used.

The channel layer 22 may also be made of polysilicon, amorphous silicon, or an oxide semiconductor material, besides any of the organic semiconductor materials exemplified above, for example. The oxide semiconductor material may include, as a major component, an oxide of one or more elements selected from the group of indium (In), gallium (Ga), zinc (Zn), tin (Sn), aluminum (Al), and titanium (Ti). Specific but non-limiting examples of the oxide semiconductor material may include an zinc oxide (ZnO), an indium tin oxide (ITO), and In—M—Zn—O where M is one or more of gallium (Ga), aluminum (Al), iron (Fe), and tin (Sn).

The channel layer 22 may be formed using the vacuum vapor deposition method; however, for example, any of the above-mentioned materials may be preferably dissolved in an organic solvent, for example, to be used as an ink solution in application/printing process to form the channel layer 22. One reason is that the application/printing process allows for cost reduction as compared with the vacuum vapor deposition method and is effective for enhancement of throughput. Specific but non-limiting examples of the application/printing process may include cast coating, spin coating, spray coating, inkjet printing, relief printing, flexo printing, screen printing, gravure printing, and gravure offset printing.

The gate insulating film 23 may be provided between the channel layer 22 and the gate electrode 24, and may have a thickness in a range of, for example, 50 nm to 1 µm. The gate insulating film 23 may be configured by an insulating film containing one or more of a silicon oxide (SiO), a silicon nitride (SiN), a silicon oxynitride (SiON), a hafnium oxide (HfO), an aluminum oxide (AlO), an aluminum nitride (AlN), a tantalum oxide (TaO), a zirconium oxide (ZrO), a hafnium oxynitride (HfON), a hafnium-silicon oxynitride (HfSiON), an aluminum oxynitride (AlON), a tantalum oxynitride (TaON), and a zirconium oxynitride (ZrON), for example. The gate insulating film 23 may have either a monolayer structure, or a layered structure, for example, using two or more materials such as an SiN film and an SiO film. In one embodiment where the gate insulating film 23 has the layered structure, it is possible to improve interface properties with respect to the channel layer 22 and to effectively suppress mixing of impurities such as moisture into the channel layer 22 from the outside. The gate insulating film 23 may be formed by application and may be patterned into a predetermined shape by means of etching thereafter. Depending on a material, however, the pattern formation may be performed by means of a printing technique such as inkjet printing, screen printing, offset printing, and gravure printing.

The gate electrode 24 may serve to apply a gate voltage to the thin-film transistor 20X to control a carrier density in the channel layer 22 by means of the gate voltage. The gate electrode 24 may be provided in a selective region on the drive substrate 11, and may be made of, for example, a metal simple substance such as platinum (Pt), titanium (Ti), ruthenium (Ru), molybdenum (Mo), copper (Cu), tungsten (W), nickel (Ni), aluminum (Al), and tantalum (Ta), or an alloy thereof. Alternatively, two or more thereof may also be stacked for use.

The planarization insulating film 25 may serve to prevent a short circuit between wiring lines such as the source electrode 21A, the drain electrode 21B, the channel layer 22, and the gate electrode 24, and planarize the surface of the drive substrate 11 on which the thin-film transistors 20X are provided. Non-limiting examples of a material structuring the planarization insulating film 25 may include polyimide-based, polyacrylate-based, epoxy-based, cresol novolak-based or polystyrene-based, polyamide-based, and fluorine-based organic insulating materials; and an inorganic material such as SiO.

The display section 20B may include the organic EL elements 10, and may be provided on the TFT section 20A. More specifically the display section 20B may be provided on the planarization insulating film 25. The organic EL elements 10 each may be a light-emitting element in which the pixel electrode 26A as an anode, the pixel separation film 27, the organic layer 28 including a light-emitting layer 28X, and a counter electrode 29 as a cathode are stacked in this order from the TFT section 20A. The counter substrate 41 may be joined onto the counter electrode 29 with the filling layer 30 being provided therebetween. The thin-film transistor 20X and the organic EL element 10 may be electrically coupled to the pixel electrode 26A through a connection hole 25A provided on the planarization insulating film 25.

The pixel electrode 26A may also serve as a reflection layer. It is preferable that the pixel electrode 26A have as high reflectance as possible in order to enhance an emission efficiency. In particular, when using the pixel electrode 26A as an anode, it is preferable that the pixel electrode 26A be made of a material having a high hole injection property. Non-limiting examples of the material of the pixel electrode 26A may include a metal simple substance such as aluminum (Al), chromium (Cr), gold (Au), platinum (Pt), nickel (Ni), copper (Cu), tungsten (W), and silver (Ag), and an alloy thereof. A transparent electrode having a large work function may preferably be stacked on the surface of the pixel electrode 26A. In the example embodiment, the pixel electrode 26A may be provided as the inorganic film 26, and may be provided together with the protection film 26B in the same layer as the protection film 26B. More specifically, the pixel electrode 26A may be formed with the same material and by the same process step as the protection film 26B that is disposed to surround the display region 110A.

The pixel separation film 27 may serve to secure an insulating property with respect to the pixel electrode 26A and the counter electrode 29, and may also serve to form a light emission region into a desired shape. The pixel separation film 27 may be made of a photosensitive resin, for example. The pixel separation film 27 may be provided around the pixel electrode 26A, allowing a region, exposed from the pixel separation film 27, of the pixel electrode 26A to serve as the light emission region. It is to be noted that, while the organic layer 28 and the counter electrode 29 are provided on the pixel separation film 27 as well, only the light emission region causes emission of light. Further, the pixel separation film 27 may extend to the peripheral region 110B. As with an opening formed on the pixel electrode 26A, an opening 27A may be formed on the protection film 26B that may be provided in the same layer as the pixel electrode 26A in the example embodiment as described above. The opening 27A may serve to separate the pixel separation film 27 into an inner peripheral part and an outer peripheral part, and may be so provided continuously on the protection film 26B as to surround the display region 110A.

The peripheral region 110B may have the separating groove A that separates the planarization insulating film 25 and the pixel separation film 27 into the inner peripheral part and the outer peripheral part. The separating groove A may serve to reduce the entry of foreign matters such as moisture from the outside into the display panel. In one specific but non-limiting example, the separating groove A may serve to reduce the entry of foreign matters such as moisture from the outside into the display region 110A.

The organic layer 28 may have a configuration in which, for example, a hole supply layer (such as a hole injection layer and a hole transport layer), the light-emitting layer 28X, and an electron supply layer (such as an electron transport layer and an electron injection layer) are stacked in order from pixel electrode 26A. Note that only the light-emitting layer 28X is illustrated among those layers. These layers may be provided as necessary. The layers that form the organic layer 28 may have different configurations from each other depending on, for example, emission colors of the organic EL elements 10R, 10G, and 10B. The hole injection layer may be provided for enhancing a hole injection efficiency, and may also serve as a buffer layer that prevents a leakage. The hole transport layer may be provided for enhancing an efficiency of transporting holes to the light-emitting layer 28X. The light-emitting layer 28X may cause recombination of electrons and holes upon application of an electric field and thus emit light. The organic EL elements 10R, 10G, and 10B each may include the light-emitting layer 28X (such as corresponding one of a red light-emitting layer, a green light-emitting layer, and a blue light-emitting layer) that emits the corresponding color light beam. The electron transport layer may be provided for enhancing an efficiency of transporting electrons to the light-emitting layer 28X. The electron injection layer may be provided for enhancing an electron injection efficiency.

The counter electrode 29 may be made of any alloy of elements such as aluminum (Al), magnesium (Mg), calcium (Ca), and sodium (Na), for example. Among the alloys, an alloy of magnesium and silver (Mg—Ag alloy) may be preferable in that the alloy of magnesium and silver has both electrical conductivity and low absorbability even with a thin film. A ratio of magnesium to silver in the Mg—Ag alloy is not particularly limited; however, a film thickness ratio of magnesium to silver may be preferably within a range of Mg:Ag=20:1 to 1:1. Further, non-limiting examples of the material of the counter electrode 29 may also include an alloy of aluminum (Al) and lithium (Li) (Al—Li alloy), and a transparent electrically-conductive oxide material such as an indium zinc oxide (IZO) and an indium tin oxide (ITO). The counter electrode 29 may be provided continuously from the display region 110A to the peripheral region 110B, and may cover the protection film 26B exposed by the opening 27A.

The filling layer 30 may be provided substantially uniformly on the sealing section 31, and may join the drive substrate 11 on which the display layer 20 is provided and the counter substrate 41 together. The sealing section 31 may be made of a material such as a silicon nitride (SiN), a silicon oxide (SiO), a silicon oxynitride (SiON), a silicon oxycarbonitride (SiOCN), and an aluminum oxide ($Al_2O_3$). The filling layer 30 may be made of a material such as an epoxy resin, a methacrylate resin, and an acrylic resin, which are either thermally curable or photo curable. Further, a sheet-like resin film may also be used to form the filling layer 30. Moreover, the filling layer 30 may not be necessarily provided; for example, the filling layer 30 may be provided only in the peripheral region 110B to allow the display region 110A to have a hollow part.

The sealing section 31 may seal, between the drive substrate 11 and the counter substrate 41, a pixel structure such as the organic EL elements 10 provided in the display region 110A. In this example, the sealing section 31 may be provided on the pixel separation film 27. The sealing section 31 may be made of a material such as an epoxy resin and an acrylic resin. A getter agent that adsorbs, for example, moisture or carbon dioxide ($CO_2$) may be added to the sealing section 31. Non-limiting examples of the sealing section 31 may also include a silicon oxide ($SiO_x$), a silicon nitride ($SiN_x$), a silicon oxynitride ($SiO_xN_y$), a titanium oxide ($TiO_x$), and an aluminum oxide ($Al_xO_y$). In one embodiment, the sealing section 31 may not be provided on the pixel separation film 27. Instead, for example, the sealing section 31 may be so provided between the drive substrate 11 and the counter substrate 41 as to be coplanar with end faces of the planarization insulating film 25 and the pixel separation film 27, or may be provided along end faces of the planarization insulating film 25, the pixel separation film 27, and the counter substrate 41.

The counter substrate 41 may seal the organic EL elements 10 together with the filling layer 30. The counter substrate 41 may be made of a material that is transparent to the color light beam emitted from each of the organic EL elements 10R, 10G, and 10B, such as glass. Unillustrated color filters such as a red filter, a green filter, and a blue filter may be provided at respective positions corresponding to the organic EL elements 10R, 10G, and 10B on a surface of the counter substrate 41 which faces the drive substrate 11. An unillustrated black matrix may be provided between the organic EL elements 10R, 10G, and 10B.

Figure 5:
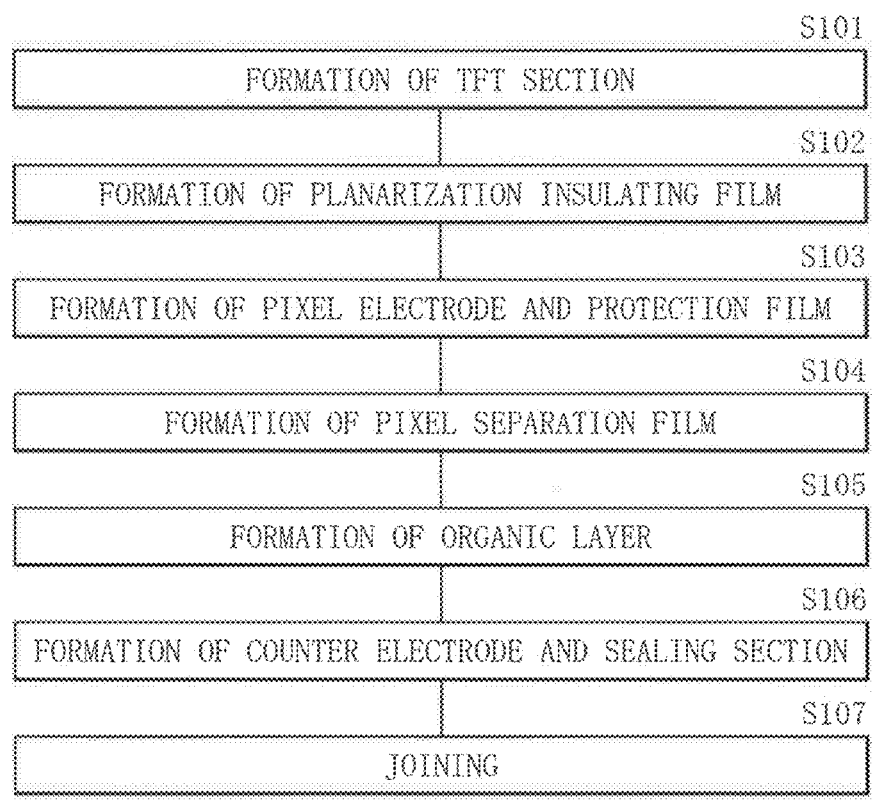
FIG. 5 is a flowchart of an example of a manufacturing process of the display unit illustrated in FIG. 1.

The display unit 1 may be manufactured, for example, in accordance with a flowchart illustrated in FIG. 5.

First, the TFT section 20A may be formed on the drive substrate 11 (step S101). More specifically, a metal film that eventually serves as the source electrode 21A and the drain electrode 21B may be formed on the entire surface of the drive substrate 11 using a method such as a sputtering method and a vacuum vapor deposition method. Thereafter, the metal film may be patterned using methods such as photolithography and etching to thereby form the source electrode 21A and the drain electrode 21B. Thereafter, the channel layer 22 and the gate insulating film 23 may be formed in order between the source electrode 21A and the drain electrode 21B. More specifically, an organic semiconductor material such as a solution of peri-Xanthenoxanthene (PXX) compound may be applied, following which the applied organic semiconductor material may be heated to form the channel layer 22. After the formation of the channel layer 22, a spin coating method may be used to apply any of the above-mentioned gate insulating film materials, such as a solution of polyvinylpyrrolidone (PVP) followed by drying. This forms the gate insulating film 23.

Thereafter, the planarization insulating film 25 may be formed on the wiring lines (such as the source electrode 21A, the drain electrode 21B, the channel layer 22, and the gate electrode 24) and the drive substrate 11 (step S102). More specifically, a photosensitive resin such as polyimide may be applied to perform patterning of the planarization insulating film 25 into a predetermined shape by means of exposure and development, followed by formation of the connection hole 25A and baking.

Thereafter, the display section 20B may be formed. First, the pixel electrode 26A and the protection film 26B may be formed on the planarization insulating film 25 (step S103). More specifically, a metal film made of, for example, aluminum (Al)/indium-tin oxide (ITO) may be formed on the planarization insulating film 25 by a method such as a sputtering method. Thereafter, the metal film at predetermined positions may be selectively removed by a method such as wet etching to form the pixel electrodes 26A separated for the respective organic EL elements 10R, 10G, and 10B and to form the protection film 26B that continuously surrounds the display region 110A. Thereafter, the pixel separation film 27 may be formed (step S104). More specifically, a photosensitive resin such as polyimide may be applied to the entire surface of the display region 110A and the peripheral region 110B, following which the opening 27A may be formed on each of the pixel electrode 26A and the protection film 26B. Thereafter, the organic layer 28 including the light-emitting layer 28X may be formed (step S105). The organic layer 28 may be formed using any method such as a coating method and a wet process including a printing method. Non-limiting examples of the coating method may include a laser transfer method, a spin coating method, a dipping method, a doctor blade method, an ejection coating method, and a spray coating method. Non-limiting examples of the printing method may include an inkjet printing method, an offset printing method, a letterpress printing method, an intaglio printing method, a screen printing method, and a microgravure coating method. A dry process and the wet process may be used in combination to form the organic layer 28 depending on properties of organic layers and materials. Alternative examples of the method of forming the organic layer 28 may include a plating method such as electroplating and electroless plating, a liftoff process, a laser ablation method, and a sol-gel method. Further, any organic layer to be subjected to the patterning, such as the light-emitting layer 28X, may be preferably formed in a region that corresponds to the display region 110A, by means of a vapor deposition method or a transfer method which utilizes the mask 1000 having the opening 1000H and a corresponding pattern, as illustrated by way of example in FIG. 6. Non-limiting examples of the vapor deposition method may include an electron beam evaporation method, a hot filament evaporation method, and a vacuum vapor deposition method. It is to be noted, however, that the foregoing methods of forming the organic layer 28 are illustrative and non-limiting.

Thereafter, the counter electrode 29 and the sealing section 31 may be formed in this order (step S106), following which the drive substrate 11 and the counter substrate 41 may be joined together (step S107). First, the color filters and the black matrix may be formed on the counter substrate 41 made of any of the above-mentioned materials. For example, the color filters and the black matrix each may be formed through application by means of a method such as a spin coating method and subsequent patterning by means of the photolithography method. Thereafter, a resin such as an acrylic resin may be used to fill a region between the drive substrate 11 and the counter substrate 41 by means of a dispenser. The resin to be used to fill the region may preferably have viscosity low enough to sufficiently fill irregularities of the display section 20B and to prevent an occurrence of vacancy, etc. For example, the resin may preferably have viscosity before curing of 1000 mPa.s or less. The foregoing process completes the display unit 1.

[1-3. Workings and Effect]

As discussed previously, display units such as televisions have been requested to have a narrower so-called bezel part around the display region in association with an improvement in mass production efficiency of a display panel and in pursuit of design of the display panel. However, in an organic EL display unit that uses an organic EL device as a display device, the entry of the foreign matters such as moisture causes deterioration in the organic EL device, which brings a pixel with the deteriorated organic EL device into a non-emission state and causes a reduction in product lifetime accordingly.

To suppress the entry of foreign matters such as moisture into an organic layer, it is effective to form a sealing section such as a gas barrier film at an outermost part of the bezel part with use of a material having low moisture permeability. An effect of suppressing the entry of moisture owing to the sealing section is closely related to quantity of permeability of moisture derived from a material structuring the sealing section. In general, the quantity of permeability (q) of moisture bears the following relationship as defined by the expression (1).

$$q = DS(C1-C2)/L \qquad (1)$$

where D is a diffusion coefficient, S is a solubility coefficient, C1 is an external gas concentration, C2 is an internal gas concentration (gas (moisture) concentration), and L is a thickness in a planar direction of the sealing section.

The diffusion coefficient D and the solubility coefficient S both depend on a material structuring the sealing section, meaning that the quantity of permeability of moisture is in inverse proportion to the thickness in the planar direction of the sealing section. Accordingly, in order to ensure a sufficient sealing property, it is necessary to provide enough thickness in the planar direction of the sealing section and thus to provide a large sealing region at the outer periphery of a display region. On the other hand, providing the large sealing region at the outer periphery of the display region serves as an obstacle in achieving the narrower bezel part. Further concerns are that the sealing property of the material structuring the sealing section itself is often insufficient and foreign matters such as moisture remaining in the material itself cause the entry of moisture into the display region over time.

To address those concerns, various improvements have been made, one of which is to provide a separating groove. The separating groove surrounds a display region, and provided on an organic insulating film that surrounds the entire surface of a support substrate. Providing the separating groove suppresses the entry of the foreign matters such as moisture from the outside and reduces entry of moisture remaining in the organic insulating film into the display region as well.

Figure 6:
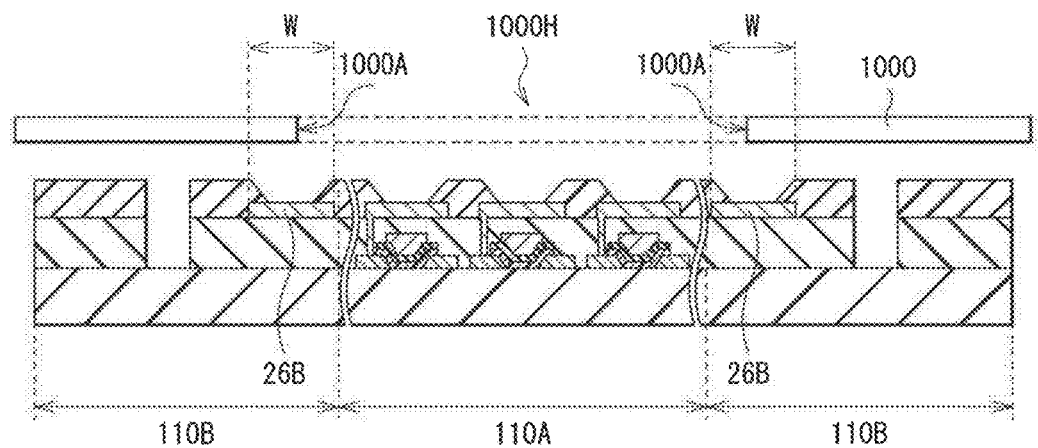
FIG. 6 schematically describes a process step of the manufacturing process illustrated in FIG. 5.

Upon forming the organic layer structuring the display device, such as the light-emitting layer, by means of a vapor deposition method, the mask 1000 may be used to define a region of the formation of the organic layer as illustrated in FIG. 6. It is necessary that the mask 1000 be brought close to a substrate to be subjected to the vapor deposition as much as possible in order to reduce a margin of the formation region. Under such circumstances, when a projection, foreign matters, etc. are attached to the end faces 1000A of the mask 1000, such a projection or foreign matters may possibly come into contact with the substrate to be subjected to the vapor deposition, which in turn may possibly damage a surface to be subjected to the vapor deposition. An occurrence of damage is more likely especially when a surface that comes into contact with the mask 1000 is made of a relatively soft organic material, such as surfaces of the pixel separation film 27 and the planarization insulating film 25 according to the example embodiment. In other words, the pixel separation film 27 and the planarization insulating film 25 are susceptible to damage. A portion with the damage leads to a defect, and thus serves as a route of entry, into the display region, of foreign matters such as moisture present outside of a display unit or remaining inside the display unit to cause a dark spot. Hence, presence of a defect in a layer provided closer to the display region than the sealing section or the separating groove is a concern that decreases reliability of a display unit.

Figure 7:
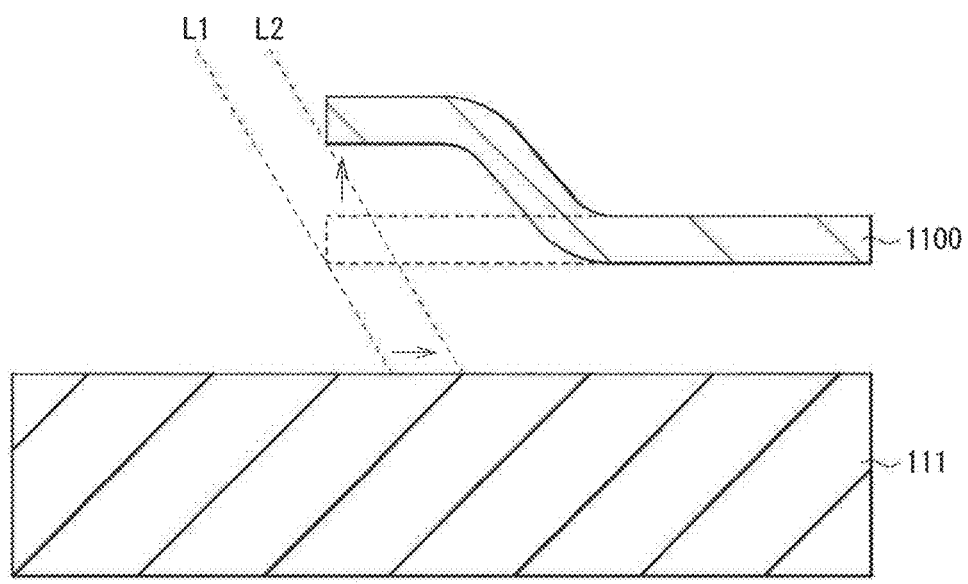
FIG. 7 schematically describes a process step of a manufacturing process according to a comparative example.

To address this concern, one measure may be to use an area mask, referred to as a mask 1100, when forming an organic layer of the display device. The mask 1100 is so deformed that an end face 1100A facing the opening is located away from a substrate 111 on which the vapor deposition is to be performed as illustrated in FIG. 7. Using the mask 1100 in which the end face 1100A facing the opening is deformed, however, results in extension of a formation region (denoted as "L2") of the thus-vapor deposited organic layer toward the peripheral region as compared with a formation region (denoted as "L1") resulting from the use of an undeformed area mask as illustrated in FIG. 7. In other words, using such a mask 1100 results in an increase in width of the bezel part of the display unit, and thus leads to an obstacle in achieving the narrower bezel part.

In contrast, the display unit 1 according to the example embodiment includes the protection film 26B provided in the peripheral region 110B. The protection film 26B continuously surrounds the display region 110A, and may be made of an inorganic material that is relatively high in hardness after the formation. In particular, the protection film 26B may be provided at a position that corresponds to the end face 1000A of the mask 1000 as illustrated in FIG. 6, making it possible to prevent a damage of a film such as the planarization insulating film 25 and the pixel separation film 27 caused by the contact of the projection of the end face 1000A of the mask 1000 or the foreign matters attached thereto with the drive substrate 11. Hence, it is possible to suppress the entry of the foreign matters such as moisture into the display region 110A.

According to the foregoing example embodiment, the protection film 26B is provided in the peripheral region 110B. The protection film 26B continuously surrounds the display region 110A, and made of an inorganic material. Hence, it is possible to suppress the entry of foreign matters such as moisture resulting from any defect that may occur in an insulating film present around a periphery of the display region 110A in an extending fashion, such as the pixel separation film 27 and the planarization insulating film 25. In particular, the protection film 26B may be provided at a position that corresponds to the end face 1000A of the mask 1000 used to form, with the vapor deposition method, the organic layer 28 structuring the organic EL element 10. This prevents a damage of an insulating film caused by the contact of the projection of the end face 1000A of the mask 1000 or the foreign matters attached thereto. Hence, it is possible to provide the display unit 1 that achieves high reliability while achieving a narrower bezel.

Further, in the present example embodiment, the protection film 26B may be provided in the same layer as the pixel electrode 26A. In other words, the protection film 26B may be formed with the same material and by the same process step as the pixel electrode 26A. Hence, it is possible to increase the reliability of the display unit 1 without increasing the number of manufacturing process steps.

In addition, the pixel separation film 27 provided on the protection film 26B may be removed. In other words, the pixel separation film 27 provided on the inorganic film 26 and extending to an end face of the peripheral region 110B may be separated into a part located in the display region 110A and a part located at the outer periphery of the part located in the display region 110A. Hence, it is possible to reduce the entry of the moisture that remains in the pixel separation film 27 into the display region 110A.

Note that the protection film 26B made of an inorganic material may be provided in a different layer from the pixel electrode 26A, as described below according to modification examples including first and second modification examples of the disclosure. Note that the same or equivalent elements as those of the example embodiment described above are denoted with the same reference numerals, and will not be described in detail.

[2. Modification Examples]
[2-1. First Modification Example]

Figure 8:
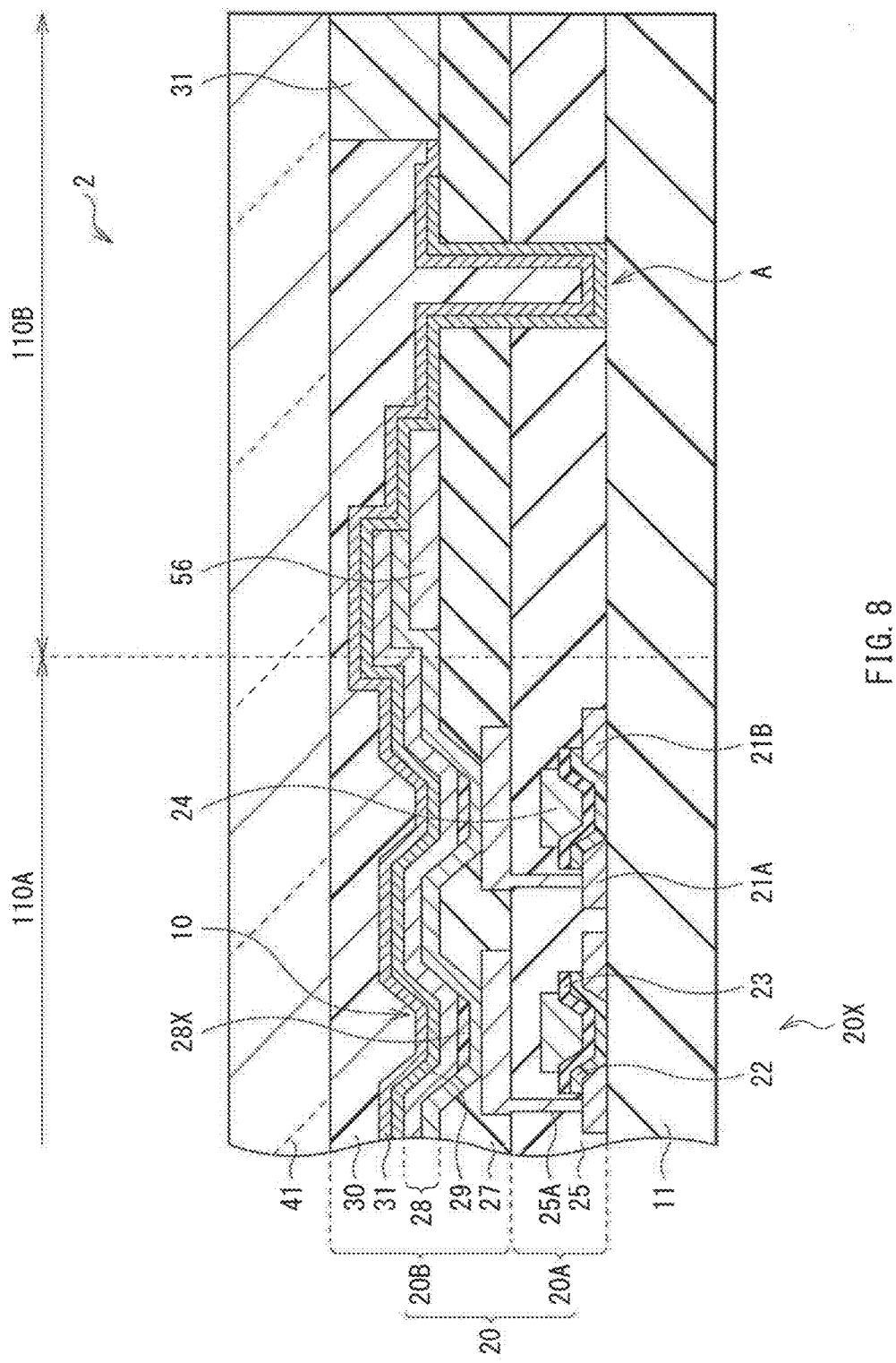
FIG. 8 is a cross-sectional view of a display unit according to a first modification example of the example embodiment of the disclosure.

FIG. 8 illustrates a cross-sectional configuration of a display unit, referred to as a display unit 2, according to a first modification example of the example embodiment of the disclosure. As with the display unit 1, the display unit 2 may be used for a display section of a television apparatus, or a display section of a mobile terminal such as a tablet device and a smartphone. The display unit 2 may include the display region 110A and the peripheral region 110B on the drive substrate 11. The peripheral region 110B may be provided around the display region 110A. The display region 110A may include the organic EL elements 10 (the organic EL elements 10R, 10G, and 10B) as the display elements. For example, the organic EL elements 10 each may emit corresponding one of the color light beams of R (red), G (green), and B (blue). The first modification example differs from the foregoing example embodiment in that a protection film 56 made of an inorganic material is provided on the pixel separation film 27 in the peripheral region 110B.

The protection film 56 may be so provided on the pixel separation film 27 in the peripheral region 110B as to surround the display region 110A continuously. In one specific but non-limiting example, the protection film 56 may be provided on the pixel separation film 27 at a position that corresponds to the end face 1000A of the opening 1000H of the mask 1000 used to form, with the vapor deposition method, the organic layer 28 structuring the organic EL element 10. The protection film 56 may be made of a material whose hardness after the formation is higher than that of the pixel separation film 27 or the planarization insulating film 25. For example, the protection film 56 may be made of a metal material such as aluminum (Al), chromium (Cr), gold (Au), platinum (Pt), nickel (Ni), copper (Cu), tungsten (W) and silver (Ag), or may be made of an inorganic insulating material such as a silicon oxide ($SiO_x$), a silicon nitride ($SiN_x$), a silicon oxynitride ($SiN_xO_y$), a titanium oxide ($TiO_x$), and an aluminum oxide ($Al_xO_y$). The protection film 56 may have a thickness in a range of 0.01 μm to 5 μm, for example.

According to the first modification example, the protection film 56 is so provided on the pixel separation film 27 in the peripheral region 110B as to surround the display region 110A continuously. Forming the protection film 56 in a different layer from the pixel electrode 26A also makes it possible to achieve effects similar to those of the foregoing example embodiment. Further, providing the protection film 56 in a layer that is closer to the mask 1000 used upon forming a layer such as the light-emitting layer 28X as in the first modification example makes it possible to prevent not only the contact of the projection of the end face 1000A of the mask 1000 or the foreign matters attached thereto but also a damage of an insulating film resulting from a contact of the mask itself. For example, the layer closer to the mask 1000 may be any layer located on or above the protection film 26B according to the foregoing example embodiment.

[2-2. Second Modification Example]

Figure 9:
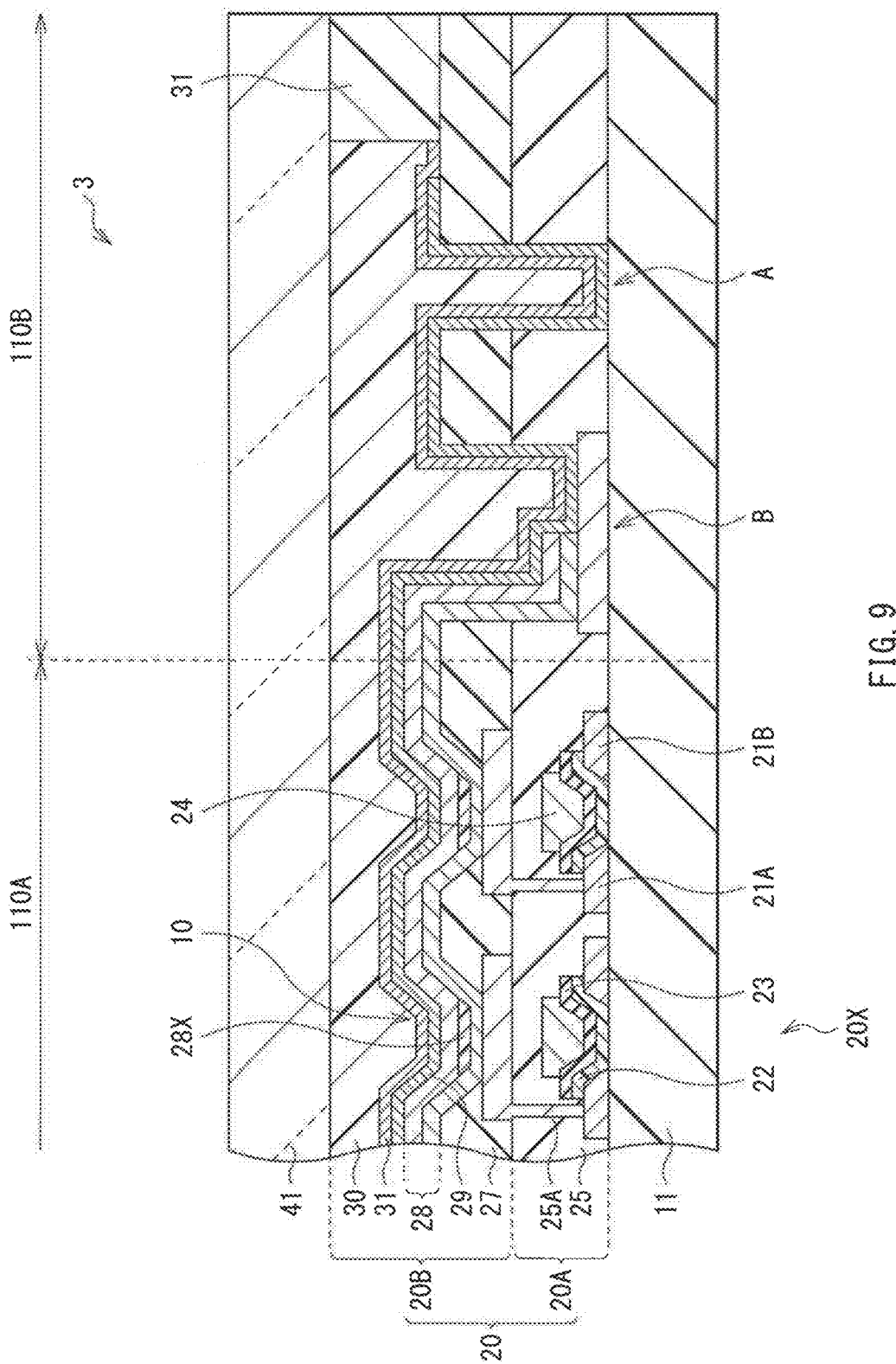
FIG. 9 is a cross-sectional view of a display unit according to a second modification example of the example embodiment of the disclosure.

FIG. 9 illustrates a cross-sectional configuration of a display unit, referred to as a display unit 3, according to a second modification example of the example embodiment of the disclosure. As with the display units 1 and 2, the display unit 3 may be used for a display section of a television apparatus, or a display section of a mobile terminal such as a tablet device and a smartphone. The display unit 3 may include the display region 110A and the peripheral region 110B on the drive substrate 11. The peripheral region 110B may be provided around the display region 110A. The display region 110A may include the organic EL elements 10 (the organic EL elements 10R, 10G, and 10B) as the display elements. For example, the organic EL elements 10 each may emit corresponding one of the color light beams of R (red), G (green), and B (blue). The second modification example differs from the foregoing example embodiment in that the planarization insulating film 25 serving as a lower layer of the pixel electrode 26A is removed, and that a protection film 66 made of, for example, an inorganic material is provided in the peripheral region 110B in the same layer as the pair of source-drain electrodes, i.e., the source electrode 21A and the drain electrode 21B, provided in the TFT section 20A.

The protection film 66 is formed in the same layer as the source electrode 21A and the drain electrode 21B as mentioned above, and may be preferably made of an inorganic insulating material such as a silicon oxide ($SiO_x$), a silicon nitride (SiN$_x$), a silicon oxynitride (SiN$_x$O$_y$), a titanium oxide (TiO$_x$), and an aluminum oxide (Al$_x$O$_y$).

According to the foregoing second modification example, a configuration is employed in which a layer configured by an organic insulating film, such as the planarization insulating film 25, is not provided in a lower layer of the protection film 66 that is so disposed in the peripheral region 110B as to surround the display region 110A. This prevents a contact of the end face 1000A of the opening 1000H of the mask 1000 itself, which is used upon the formation of the organic layer 28 structuring the organic EL element 10 by means of the vapor deposition method. This in turn makes it possible to prevent the entry of moisture attributed to a route formed by a defect that is caused by the contact of the end face 1000A. Hence, it is possible to provide the display unit 3 that achieves high reliability while achieving a narrower bezel.

Further, a configuration according to the second modification example forms a separating groove B that separates each of the planarization insulating film 25 and the pixel separation film 27 into an inner peripheral part and an outer peripheral part at a location that is closer to the display region 110A than the separating groove A. This configuration further reduces the entry, into the display region 110A, of the moisture that remains in the planarization insulating film 25 and the pixel separation film 27 that are provided in the peripheral region 110A. Hence, it is possible to provide the display unit 3 having higher reliability.

[3. Application Examples]

A description is given below of some application examples of the display units 1 to 3 described in the example embodiment and the first and the second modification examples. The display unit according to any of the above-described example embodiment and the modification examples is applicable to a display unit of an electronic apparatus in various fields that displays, as an image or a picture, an image signal supplied from outside or an image signal generated inside the electronic apparatus. Non-limiting examples of the electronic apparatus may include a television, a digital camera, a laptop personal computer, a portable terminal apparatus such as a mobile phone, and a video camera. The display unit is suitable especially for a small- and mid-sized displays for mobile use without limitation. The followings are some application examples.

[First Application Example]

Figure 10A:
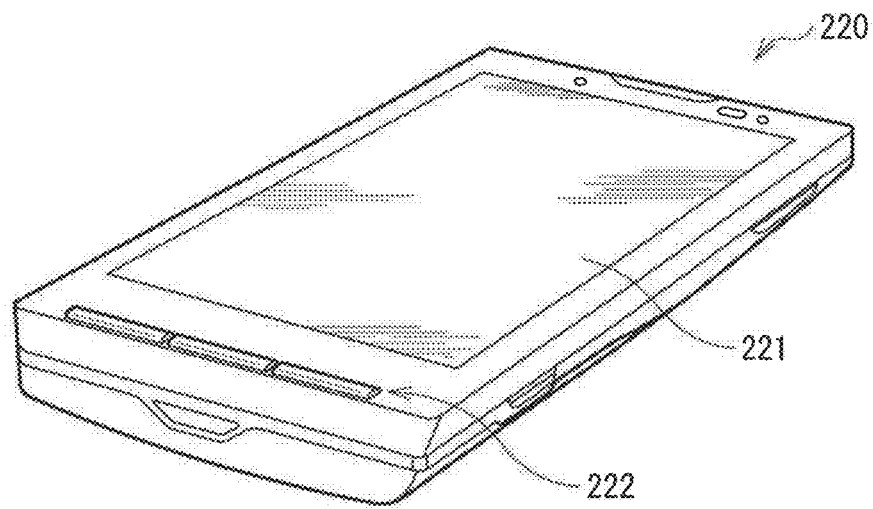
FIG. 10A is a perspective view of an outer appearance according a first application example as viewed from the front.
Figure 10B:
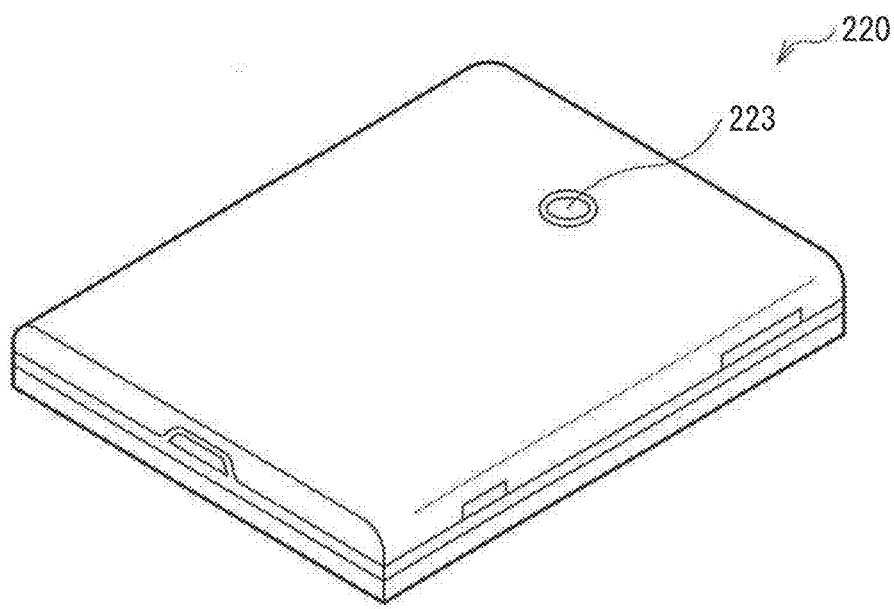
FIG. 10B is a perspective view of an outer appearance according to the first application example as viewed from the back.

FIGS. 10A and 10B each illustrate an outer appearance of a smartphone 220 according to a first application example. The smartphone 220 may include, for example, a display section 221 and an operation section 222 on front side, and a camera 223 on back side. Any of the display units 1 to 3 according to the foregoing example embodiment and the modification examples may be mounted on the display section 221.

[Second Application Example]

Figure 11A:
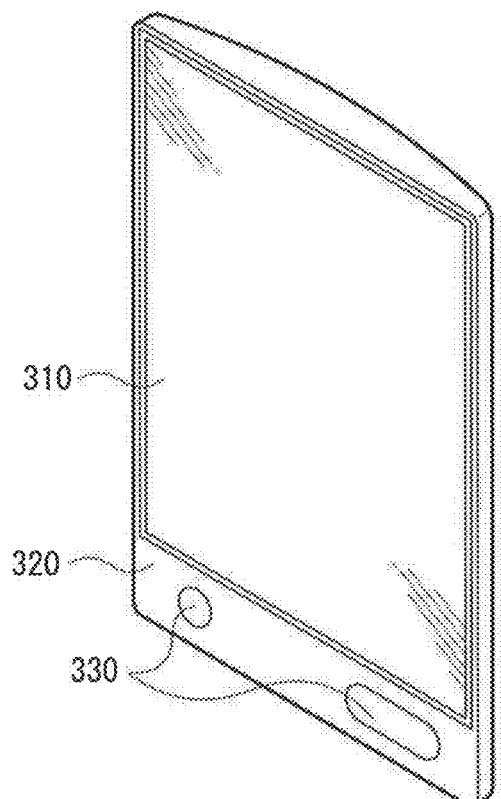
FIG. 11A is a perspective view of an example of an outer appearance according to a second application example.
Figure 11B:
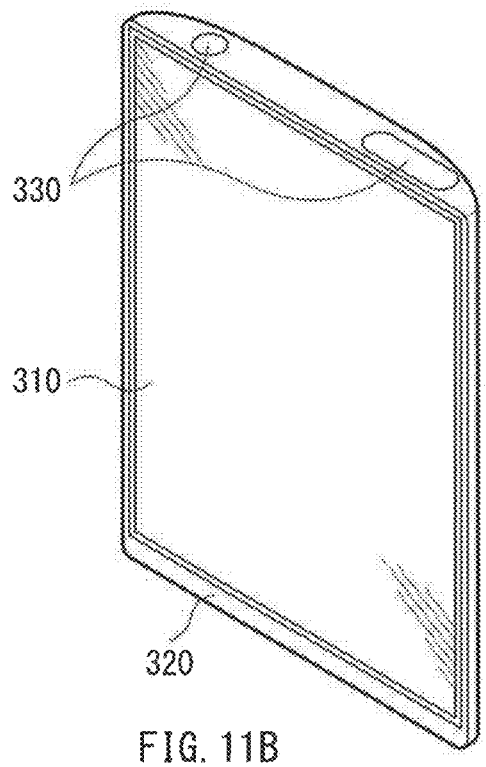
FIG. 11B is a perspective view of another example of the outer appearance according to the second application example.

FIGS. 11A and 11B each illustrate an outer appearance of a tablet personal computer according to a second application example. The tablet personal computer may have a housing (a non display section) 320 on which a display section 310 and an operational section 330 are disposed, for example. Any of the display units 1 to 3 according to the foregoing example embodiment and the modification examples may be mounted on the display section 310.

[Third Application Example]

Figure 12:
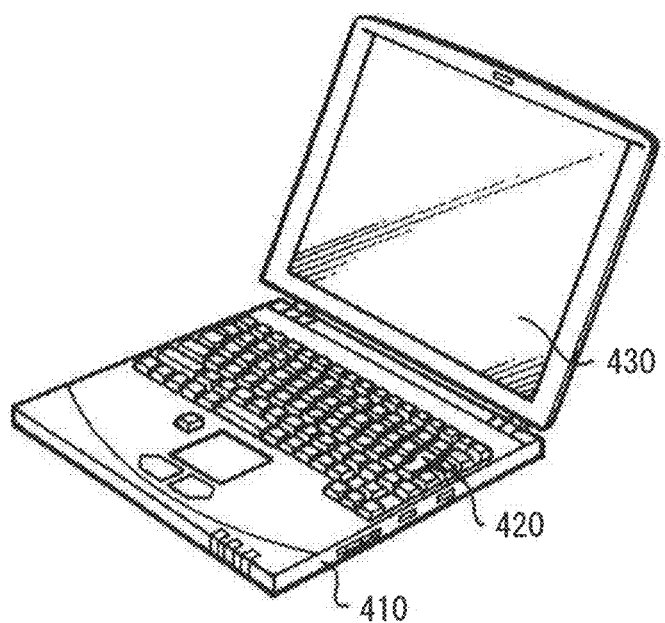
FIG. 12 is a perspective view of an outer appearance according to a third application example.

FIG. 12 illustrates an outer appearance of a laptop personal computer according to a third application example. The laptop personal computer may have, for example, a main body 410, a keyboard 420 for input operation of letters, etc., and a display section 430 that displays an image. The display section 430 may be configured by any of the display units 1 to 3 according to the above-described example embodiment and the modification examples.

Although the disclosure has been described by way of example with reference to the example embodiment, the modification examples, and the application examples, the technology is not limited thereto but may be modified in a wide variety of ways.

For example, in each of the example embodiment and the modification examples, the description has been given of the display unit that is the top surface light-emitting display unit (top emission display unit); however, this is not limitative. For example, the display unit may also be a bottom surface light-emitting display unit (bottom emission display unit). In one embodiment where the display unit is the bottom surface light-emitting display unit, the pixel electrode 26A may be made of a material such as ITO, IZO and ZnO, and the counter electrode 29 may be made of a material such as Al and MgAg, or may be configured by a layered structure having a configuration such as ITO/Ag/ITO. Further, the bottom surface light-emitting display unit may be formed with a layering order in which the organic layer 28 is layered reversely to the example embodiment and the modification examples. In this case, the color filter 13A may be provided between the gate insulating film 23 and a layer in which the TFT (Tr1) or other components are formed. In one embodiment where the display unit is a combustible light-emitting display unit, light emitted from the light-emitting layer inside the organic layer 28 may be transmitted through the lower electrode and the drive substrate 11 to be extracted to the outside. Any of such display units may also have a so-called microcavity (micro-resonator) structure in which a plurality of layers having a predetermined refractive index difference are layered between a pair of reflective films, for example. The microcavity structure allows for optical confinement through repetitive reflection of incident light between the pair of reflective films.

Further, the description has been given referring specifically to the configuration of the organic EL element in the example embodiment, the modification examples, and the application examples. However, all of the layers do not necessarily have to be included, or any other layer may also be included. For example, in the example embodiment, the modification examples, and the application examples, the organic layer 28 of the organic EL element 10 has a layered structure in which the hole injection layer, the hole transport layer, the light-emitting layer 28X, the electron transport layer, and the electron injection layer are layered in order from the pixel electrode 26A; however, this is not limitative. For example, the organic EL element 10 may be a white organic EL element having a so-called tandem structure in which a blue light-emitting layer and a yellow light-emitting layer are layered.

In the second modification example, the protection film 66 is formed in the same layer as the source electrode 21A and the drain electrode 21B. In an alternative example, the separating groove B may be formed on the planarization insulating film 25 as illustrated in FIG. 9 after the formation of the planarization insulating film 25, and the protection film 66 may thereafter be formed in the separating groove B in the same layer as the pixel electrode 26A, for example. In this example, at least a part of the pixel separation film 27, formed on the protection film 66 after the formation of the pixel electrode 26A and the protection film 66, may be preferably removed such that the pixel separation film 27 is separated on the protection film 66 into the inner peripheral part and the outer peripheral part as with the example embodiment.

Moreover, out of the planarization insulating film 25 and the pixel separation film 27 that are separated by the separating groove A, a part of the planarization insulating film 25 and a part of the pixel separation film 27 both provided on the outer peripheral side may be removed.

In addition, the description has been given of the active matrix display unit in the example embodiment and the modification examples; however, any embodiment of the disclosure may also be applied to a passive matrix display unit. Further, a configuration of the pixel drive circuit that performs an active matrix drive is not limited to each of those described in the example embodiment and the modification examples; any device such as a capacitor and a transistor may also be added as necessary. In this case, a necessary drive circuit may also be added, in addition to the signal line drive circuit 120 and the scanning line drive circuit 130, depending on alteration of the pixel drive circuit.

The description has been given of three types of pixels of the red pixel 5R, the green pixel 5G, and the blue pixel 5B as color pixels in the example embodiment and the modification examples. However, this is not limitative; for example, any color pixel such as a white pixel 5W and a yellow pixel 5Y may also be combined.

Furthermore, the technology encompasses any possible combination of some or all of the various examples described herein and incorporated herein.

It is possible to achieve at least the following configurations from the above-described example embodiments of the disclosure.

(1) A display unit including:
 a display region in which a plurality of pixels are disposed;
 a peripheral region provided outside the display region; and
 an inorganic film that is provided in the peripheral region, and surrounds the display region continuously.

(2) The display unit according to (1), wherein
 the plurality of pixels each include a light-emitting element, the light-emitting element having a first electrode, an organic layer that includes at least a light-emitting layer, and a second electrode in order on a substrate; and
 the inorganic layer is provided in same layer as the first electrode.

(3) The display unit according to (1) or (2), further including a pixel separation film provided between the plurality of pixels and extending from the display region to the peripheral region, wherein
 at least a part of the pixel separation film located on the inorganic film is removed.

(4) The display unit according to (2) or (3), wherein
 the second electrode is configured by an electrically-conductive film provided for the plurality of pixels continuously and extending from the display region to the peripheral region, and
 at least a part of the inorganic film is covered with the electrically-conductive film.

(5) The display unit according to any one of (2) to (4), further including:
 a thin-film transistor provided between the substrate and the light-emitting element; and
 an insulating layer provided between the substrate and the light-emitting element, and covering the thin-film transistor, the insulating layer having a separating groove that extends from the display region to the peripheral region, and separates, in the peripheral region, the insulating layer into an inner peripheral part and an outer peripheral part.

(6) An electronic apparatus with a display unit, the display unit including:
 a display region in which a plurality of pixels are disposed;
 a peripheral region provided outside the display region; and
 an inorganic film that is provided in the peripheral region, and surrounds the display region continuously.

In the display unit and the electronic apparatus according to the embodiments of the disclosure, the inorganic film that continuously surrounds the display region is provided in the peripheral region provided outside the display region. This suppresses the entry of foreign matters such as moisture into the display region.

The display unit and the electronic apparatus according to the embodiments of the disclosure each include the inorganic film. The inorganic film is provided in the peripheral region provided outside the display region and surrounds the display region continuously, thus suppressing the entry of the foreign matters such as moisture into the display region. Hence, it is possible to provide the display unit that achieves high reliability while achieving a narrower bezel, and the electronic apparatus that includes the display unit.

Note that effects described herein are illustrative and non-limiting. Effects achieved by the technology may be those that are different from the above-described effects, or may include other effects in addition to those described above.

Although the technology has been described in terms of exemplary embodiments, it is not limited thereto. It should be appreciated that variations may be made in the described embodiments by persons skilled in the art without departing from the scope of the technology as defined by the following claims. The limitations in the claims are to be interpreted broadly based on the language employed in the claims and not limited to examples described in this specification or during the prosecution of the application, and the examples are to be construed as non-exclusive. For example, in this disclosure, the term "preferably", "preferred" or the like is non-exclusive and means "preferably", but not limited to. The use of the terms first, second, etc. do not denote any order or importance, but rather the terms first, second, etc. are used to distinguish one element from another. The term "substantially" and its variations are defined as being largely but not necessarily wholly what is specified as understood by one of ordinary skill in the art. The term "about" or "approximately" as used herein can allow for a degree of variability in a value or range. Moreover, no element or component in this disclosure is intended to be dedicated to the public regardless of whether the element or component is explicitly recited in the following claims.

What is claimed is:
1. An electronic apparatus comprising:
 a display region comprising a plurality of pixels are disposed;
 a peripheral region outside the display region;
 an inorganic film in the peripheral region, wherein the inorganic film surrounds the display region continuously;
 a pixel separation film between adjacent pixels of the plurality of pixels, wherein the pixel separation film exposes a portion of the inorganic film, each pixel of the plurality of pixels comprises a light-emitting element, the light-emitting element comprising:
   a first electrode,
   an organic layer on the first electrode, wherein the organic layer comprises a light-emitting layer, and the organic layer is over the pixel separation film, and
   a second electrode on the organic layer, wherein the second electrode extends continuously from the display region to the peripheral region and directly contacts the inorganic film; and
a separating groove extending through the pixel separation film, wherein the inorganic film is between the separating groove and the display region, and the second electrode extends into the separating groove,
   wherein the organic layer directly contacts a sidewall of the inorganic film.

2. An electronic apparatus comprising:
   a display region comprising a plurality of pixels;
   a peripheral region outside the display region;
   an inorganic film in the peripheral region, wherein the inorganic film surrounds the display region continuously;
   a pixel separation film between adjacent pixels of the plurality of pixels,
   each pixel of the plurality of pixels comprises a light-emitting element, the light-emitting element comprising:
      a first electrode,
      an organic layer on the first electrode, wherein the organic layer comprises a light-emitting layer and the organic layer is over the pixel separation film, and
      a second electrode on the organic layer,
   wherein
      the second electrode extends continuously from the display region to the peripheral region and directly contacts the inorganic film, and
      the inorganic film is over the pixel separation film.

3. The electronic apparatus according to claim 2, wherein the organic layer directly contacts the inorganic film.

4. The electronic apparatus according to claim 2, further comprising a separating groove extending through the pixel separation film, wherein the inorganic film is between the separating groove and the display region.

5. The electronic apparatus according to claim 4, wherein the second electrode extends into the separating groove.

6. The electronic apparatus according to claim 4, wherein the second electrode directly contacts the pixel separation film between the inorganic film and the separating groove.

7. The electronic apparatus according to claim 4, further comprising a sealing section film over the second electrode, wherein the sealing section film extends into the separating groove.

8. The electronic apparatus according to claim 4, wherein the second electrode directly contacts a sidewall of the inorganic film.

9. An electronic apparatus comprising:
   a display region comprising a plurality of pixels;
   a peripheral region outside the display region;
   an inorganic film in the peripheral region, wherein the inorganic film surrounds the display region;
   each pixel of the plurality of pixels comprises a light-emitting element, the light-emitting element comprising:
      a first electrode,
      an organic layer on the first electrode, wherein the organic layer comprises a light-emitting layer, and
      a second electrode on the organic layer, wherein the second electrode is a continuous layer, and the second electrode directly contacts the inorganic film,
      wherein the organic layer directly contacts the inorganic film.

10. The electronic apparatus according to claim 9, further comprising:
   a pixel separation film between adjacent pixels of the plurality of pixels.

11. The electronic apparatus according to claim 10, wherein the inorganic film is over the pixel separation film.

12. The electronic apparatus according to claim 11, further comprising a separating groove extending through the pixel separation film, wherein the inorganic film is between the separating groove and the display region.

13. The electronic apparatus according to claim 12, wherein the second electrode extends into the separating groove.

* * * * *